United States Patent [19]
Masiulis

[11] Patent Number: 4,920,450
[45] Date of Patent: Apr. 24, 1990

[54] TEMPERATURE DEPENDENT CAPACITOR

[75] Inventor: Joseph Masiulis, Elmhurst, Ill.

[73] Assignee: Motorola, Inc., Schaumburg, Ill.

[21] Appl. No.: 370,535

[22] Filed: Jun. 23, 1989

[51] Int. Cl.⁵ .................. H01G 7/00; H01P 5/107;
H05K 1/18
[52] U.S. Cl. ................................ 361/282; 333/26;
361/401
[58] Field of Search ............... 361/282, 285, 400–402;
333/26, 209

[56] References Cited
U.S. PATENT DOCUMENTS

| 3,349,162 | 10/1967 | Eckhardt et al. | 361/401 X |
| 3,740,677 | 6/1973 | Kommrusch | 333/82 BT |
| 4,251,849 | 2/1981 | Kawai | 361/400 X |
| 4,599,907 | 7/1986 | Kraus et al. | 361/285 X |
| 4,691,179 | 9/1987 | Blum et al. | 333/209 X |
| 4,725,793 | 2/1988 | Igarashi | 333/26 |

Primary Examiner—Donald A. Griffin
Attorney, Agent, or Firm—John W. Hayes

[57] ABSTRACT

A temperature dependent capacitor formed from thermostatic bi-metallic strips is used to compensate the resonant frequency of a microstrip patch antenna array structure for dielectric constant thermal effects.

4 Claims, 3 Drawing Sheets

TEMPERATURE DEPENDENT CAPACITOR

TECHNICAL FIELD

This invention relates generally to temperature dependent capacitors.

BACKGROUND ART

Narrow bandwidth has been one of the inherent major limitations of microstrip antennas where precise input voltage standing wave ratio (VSWR), maximum possible power gain, radiation pattern, and polarization characteristics have to be maintained over a wide operating temperature range. Changes in the antenna operating temperature affect the resonant frequency through thermal expansion, but primarily through changes in the substrate dielectric constant. The resonant frequency change can become comparable to the operating bandwidth, thus degrading the VSWR, gain, and other antenna parameters.

The resonant frequency of a radiating structure built on a Teflon-based substrate tends to increase with increasing temperature, as is well known in the art, due to thermal expansion and the negative temperature coefficient of substrate permittivity. One method for changing the resonant frequency of microstrip patch antennas is to use high-Q gallium arsenide (GaAs) varactor diodes connected to the radiating edges of the structure. This is an active temperature compensation scheme requiring an external power supply to bias the varactors and hence vary their capacitance. However, substrate size must be increased in order to accommodate the addition of these discrete GaAs components. In addition, GaAs varactor diodes are relatively expensive.

Accordingly, a need arises for a passive temperature compensation scheme that is relatively inexpensive to implement and does not have the size disadvantages of other approaches.

SUMMARY OF THE INVENTION

According to the invention, a temperature dependent capacitor is provided on a substrate which has a first conductive surface, such as one or more radiating elements, and a second conductive surface, such as a ground plane, separated by dielectric material having an opening. The capacitor comprises a first plate with one (proximal) portion connected to the first conductive surface and another (distal) portion extending into the opening, and a second plate which has its first or proximal portion connected to the second conductive surface and its second or distal portion extending into the opening. The portions of the two plates which extend into the opening move with respect to one another in response to changes in temperature. Thus, a capacitance which varies with temperature is provided between the first and second conductive surfaces.

In general, the plates that comprise the temperature dependent capacitor are constructed from thermostatic bimetallic strips. Each of these strips includes a layer of high expansion alloy bonded to a layer of low expansion alloy. In the preferred embodiment, one of the plates has a layer of electrically insulating material designed to prevent the two plates from touching, and thus shorting together electrically.

DETAILED DESCRIPTION OF THE INVENTION

Figure 1A:
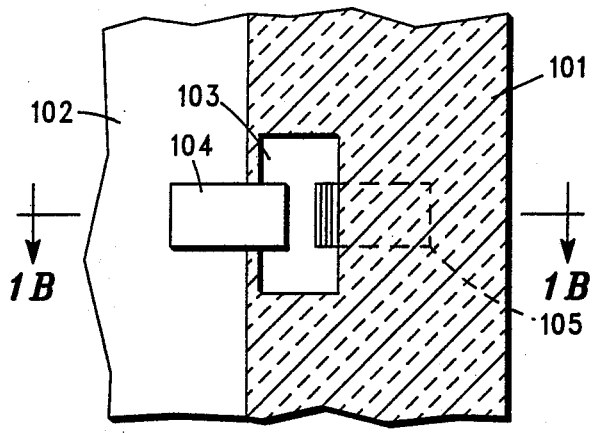
FIG. 1A is a top view of a portion of a substrate showing the temperature dependent capacitor of the present invention.
Figure 1B:
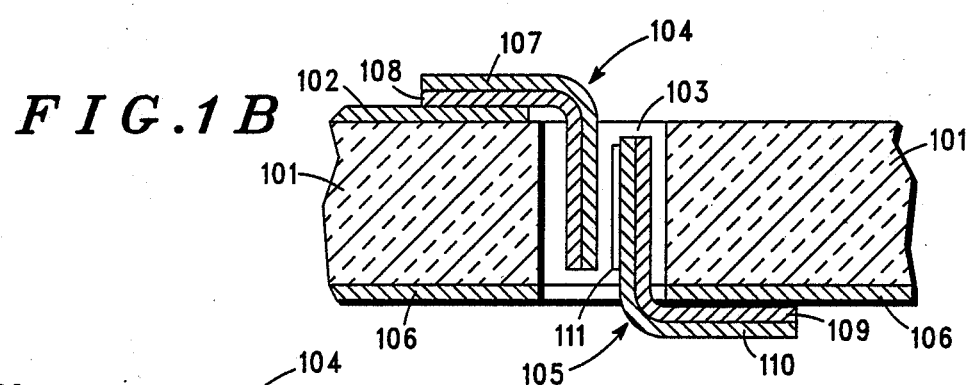
FIG. 1B is an expanded section view of the section identified as 1B—1B in FIG. 1A.

FIGS. 1A and 1B illustrate a portion of a substrate which has a conductive surface (102) on its upper portion. The conductive surface (102) may be a radiating element in a microstrip patch antenna array. The substrate also has a conductive surface (106) on its bottom portion. The conductive surfaces are separated by a dielectric material (101). The substrate has an opening (103) that extends through the dielectric material (101) and through the conductive surface (106) on the bottom, but is adjacent to the conductive surface (102) on the top in the preferred embodiment. Of course, the opening (103) in the dielectric material (101) may also extend through the conductive surface (102) on the top portion. The temperature dependent capacitor is formed by a first plate (104) that is connected to the conductive surface (102) on the top portion and also extends into the opening (103). The temperature dependent capacitor also includes a second plate (105) which is attached to the conductive surface (106) on the bottom portion and also has a portion which extends into the opening (103).

The expanded section view of section 1B—1B from FIG. 1A that is depicted in FIG. 1B further illustrates that the first plate, as generally depicted by the number 104, has an inner layer (108) of high expansion alloy and an outer layer (107) of low expansion alloy. A second plate, as generally depicted by the number 105, also has an inner layer (109) comprising a high expansion alloy, and an outer layer (110) comprising a low expansion alloy. In the preferred embodiment, the second plate (105) also includes an electrically insulating layer (111) on a surface facing the other plate (104). This electrically insulating layer (111) prevents an electrical short from occurring should the plates (104 and 105) come in contact with one another.

Figure 2A:
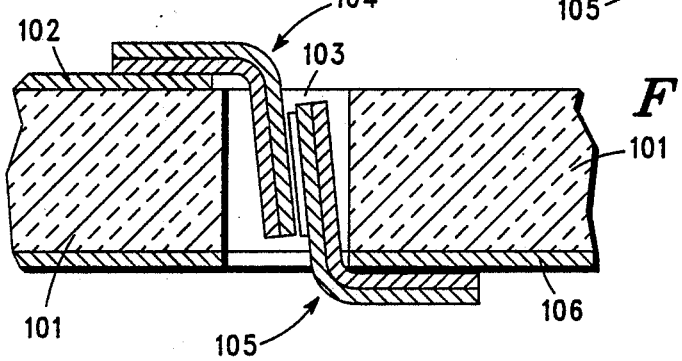
FIG. 2A illustrates the orientation of the plates of the temperature dependent capacitor under relatively high temperature conditions.

FIG. 2A illustrates the configuration of the temperature dependent capacitor of the present invention under conditions of relatively high temperature. Under high temperature conditions, the plates (104 and 105) move torward one another due to the different rates of thermal expansion of their constituent alloys. This causes the distance between the plates to decrease, with a resulting increase in the capacitance between the upper conductive layer (102) and the lower conductive layer (106).

Figure 2B:
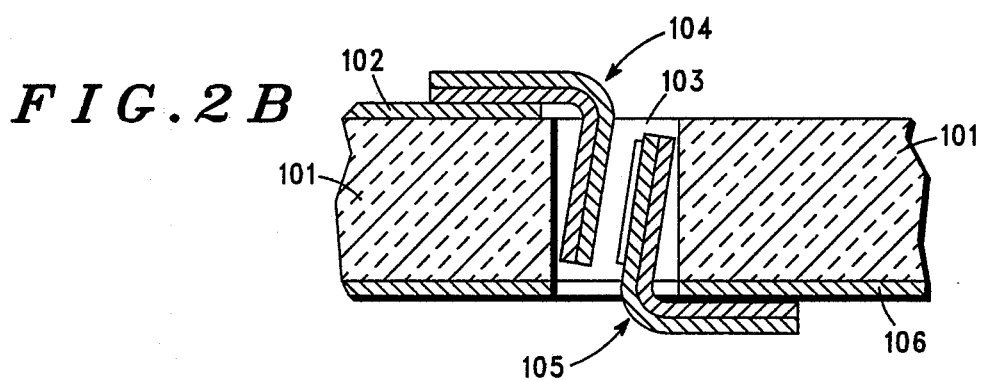
FIG. 2B illustrates the plate orientation at a relatively low temperature.

FIG. 2B shows the temperature dependent capacitor under relatively low temperature conditions. As the temperature decreases, the plates (104 and 105) move farther apart. This increase in separation results in a decrease in the capacitance between the first conductive surface (102) and the second conductive surface (106).

Figure 3:
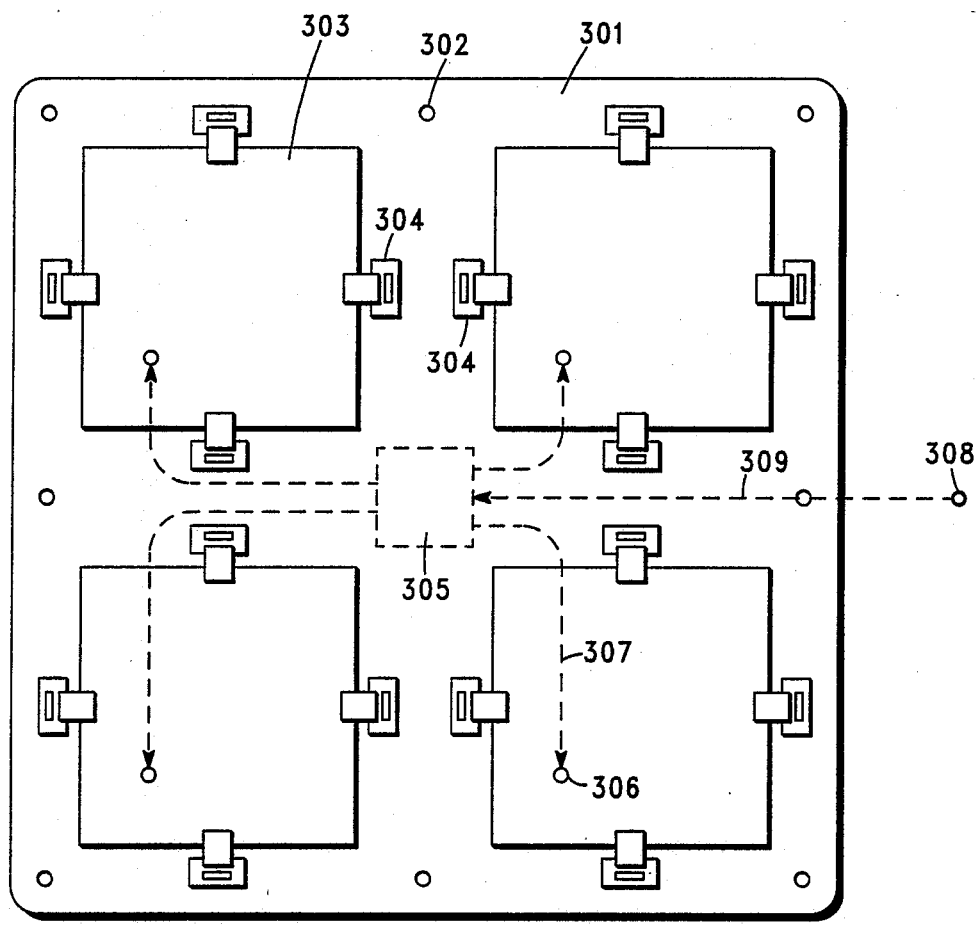
FIG. 3 shows a microstrip patch antenna array structure utilizing the temperature compensation method of the present invention.

A microstrip patch antenna array, as generally depicted by the number 300, is shown in FIG. 3. The substrate (301) includes mounting holes (302) to facilitate securing the microstrip antenna array to another supporting structure (not shown). The antenna array consists of radiating elements (303) having a predetermined electrical size and resonant frequency. The antenna feed points (306) are on the diagonals of the resonant patches in order to excite the ±jB degenerate resonant modes for right hand circularly polarized radiation, as is well known in the art. RF power is applied to the antenna array via an input port (308), through an input feed line (309), and thus to a power divider (305). From the power divider (305), feed lines (307) deliver RF power to the resonator feed points (306). The input line (309), power divider (305), and feed lines (307) are shown in dashed lines, since they may be implemented as discrete components or by utilizing microstrip transmission line design techniques as are well known.

Temperature dependent bi-metallic plate capacitors (304) are disposed about the radiating edges of the radiating elements (303). The resonant frequency of a radiating structure built on Teflon-based material tends to increase with increasing temperature due to thermal expansion and the negative temperature coefficient of substrate permittivity. The capacitance of the temperature dependent bi-metallic capacitors (304) increases in value with increasing temperature. This increase in capacitive loading translates into an increase in the effective electrical size of the resonators (303) with a corresponding decrease in the resonant frequency, which cancels the increase due to dielectric constant thermal effects.

Figure 4:
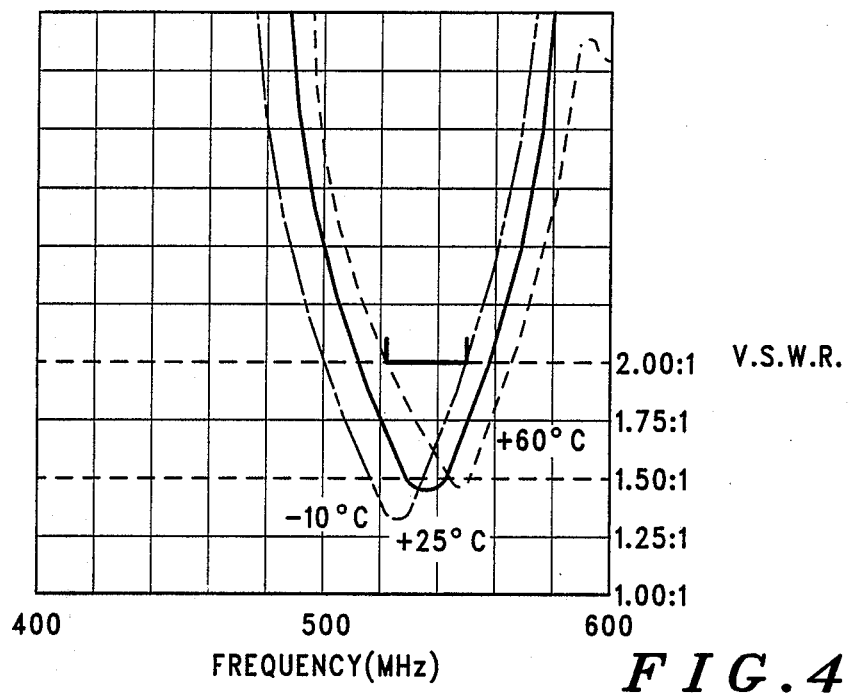
FIG. 4 shows VSWR versus temperature for the microstrip patch antenna array of FIG. 3 without temperature compensation.

FIG. 4 shows the volage standing wave ratio (VSWR) versus temperature characteristics of a microstrip patch antenna array structure similar to that depicted in FIG. 3, but without the temperature compensating effects of the temperature dependent capacitors of the present invention. As can be seen in the figure, the VSWR versus temperature characteristic at room temperature (+25° C.), represented by the solid line, has a resonant frequency of approximately 540 MHz and a VSWR, near resonance, of better than 1.50:1. But an examination of the low temperature (−10° C.) curve shown by the dotted line, and the high temperature (+60° C.) curve indicated by the dashed line illustrates that the resonant frequency shifts significantly with temperature. Because of the drastic degradation of VSWR away from resonance, the antenna is useful only over a very limited range, even if a VSWR as high as 2.00:1 were deemed acceptable.

Figure 5:
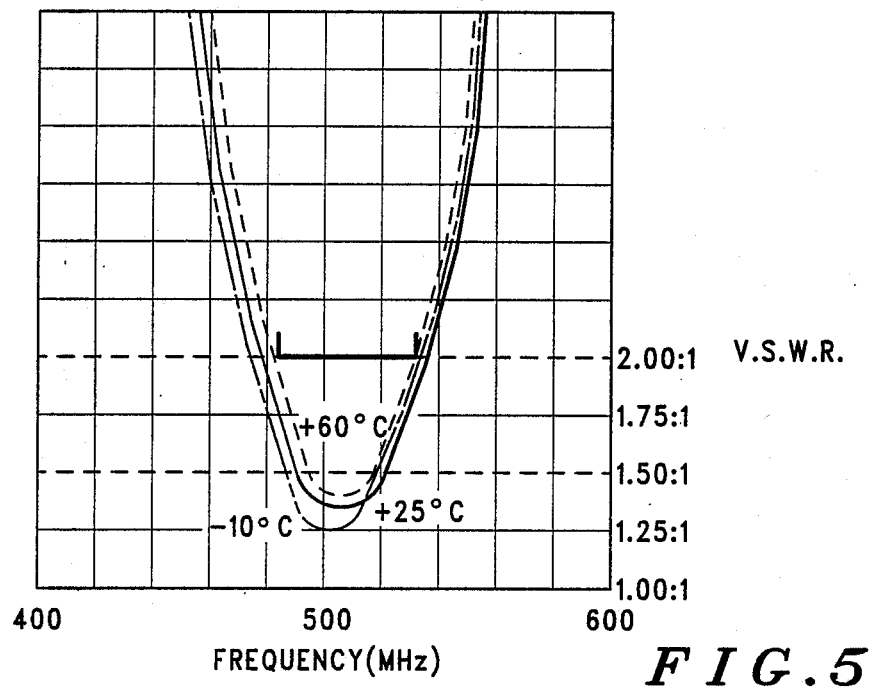
FIG. 5 depicts the VSWR versus temperature characteristics of the microstrip patch antenna array of FIG. 3 utilizing the temperature compensation method of the present invention.

FIG. 5 depicts VSWR versus temperature characteristics for the microstip patch antenna array structure of FIG. 3 incorporating the temperature compensation method of the present invention. As can be seen from the figure, the characteristic curves representing VSWR at the temperatures of interest are nearly overlapping, thus yielding a useful bandwidth even at a VSWR of better than 1.50:1. A significantly larger useful bandwidth is available if the VSWR constraint is lowered to an acceptable VSWR of as much as 2.00:1.

What is claimed is:

1. On a substrate having a first conductive surface and a second conductive surface separated by a dielectric material, and having an opening at least through the dielectric material, a temperature dependent capacitor comprising:
   a first plate having a proximal portion operatively connected to the first conductive surface and a distal portion extending into the opening;
   a second plate having a proximal portion operatively connected to the second conductive surface and a distal portion extending into the opening, such that the distal portions of the first and second plates move with respect to one another in response to changes in temperature to provide a temperature dependent capacitance between the first and second conductive surfaces.

2. The temperature dependent capacitor of claim 1, wherein at least one of the first and second plates is a thermostatic bi-metallic strip.

3. The temperature dependent capacitor of claim 2, wherein the thermostatic bi-metallic strip includes a first layer of high expansion alloy and a second layer of low expansion alloy.

4. The temperature dependent capacitor of claim 1, wherein at least one of the first and second plates has a layer of electrically insulating material on a surface facing the other plate.

* * * * *